United States Patent [19]

Foote

[11] Patent Number: 4,634,965
[45] Date of Patent: Jan. 6, 1987

[54] CHARGE BALANCING DETECTION CIRCUIT

[75] Inventor: Steven A. Foote, Redmond, Wash.

[73] Assignee: Sundstrand Data Control, Inc., Redmond, Wash.

[21] Appl. No.: 687,648

[22] Filed: Dec. 31, 1984

[51] Int. Cl.[4] .......................................... G01R 27/26
[52] U.S. Cl. .............................. 324/60 C; 324/61 R; 73/517 B
[58] Field of Search ................ 324/61 R, 60 C, 60 R, 324/60 CD, DIG. 1, 130, 123; 73/517 B, 517 R; 318/662; 330/9; 340/870.37

[56] References Cited

U.S. PATENT DOCUMENTS

| | | | |
|---|---|---|---|
| 2,790,898 | 4/1957 | Bady | 250/20 |
| 3,376,482 | 4/1968 | Barthel | 318/32 |
| 3,424,990 | 1/1969 | Escobosa | 329/50 |
| 3,436,684 | 4/1969 | Mack | 332/47 |
| 3,436,685 | 4/1969 | Mack | 332/47 |
| 3,694,748 | 9/1972 | Hekimian | 324/103 P |
| 3,714,593 | 1/1973 | Kime et al. | 329/50 |
| 3,764,925 | 10/1973 | Von Nikelsberg et al. | 329/50 |
| 3,777,181 | 12/1973 | Bancroft | 307/232 |
| 3,869,676 | 3/1975 | Harrison et al. | 329/204 X |
| 3,965,435 | 6/1976 | Kriedt et al. | 329/101 |
| 3,974,453 | 8/1976 | Ohsawa | 329/50 |
| 3,999,138 | 12/1976 | Peil et al. | 329/2 |
| 4,102,202 | 7/1978 | Ferriss | 73/517 B |
| 4,206,400 | 6/1980 | Holdren et al. | 324/61 R |
| 4,319,195 | 3/1982 | Matsumura | 329/101 |
| 4,319,196 | 3/1982 | Kwan | 329/204 |
| 4,320,346 | 3/1982 | Healey, III | 329/101 |
| 4,336,718 | 6/1982 | Washburn | 73/517 B |
| 4,342,000 | 7/1982 | Ogita | 329/103 |
| 4,345,474 | 8/1982 | Deval | 73/517 B |
| 4,370,620 | 1/1983 | Tin | 329/196 |
| 4,426,623 | 1/1984 | Wilkens et al. | 329/178 |
| 4,464,721 | 8/1984 | McKenna | 73/517 B |

Primary Examiner—Reinhard J. Eisenzopf
Assistant Examiner—Jack B. Harvey
Attorney, Agent, or Firm—Christensen, O'Connor, Johnson & Kindness

[57] ABSTRACT

Prior detection circuits for measuring capacitance differences have commonly included error source, such as P-N junctions, in the DC signal path. The present invention provides an improved detection circuit for measuring the capacitance difference between first ($C_1$) and second ($C_2$) capacitive elements. The detection circuit comprises a first capacitor ($C_3$) serially connected to the first capacitive element at a first common node (36) to form a first series circuit, and a second capacitor ($C_4$) serially connected to the second capacitive element at a second common node (38) to form a second series circuit. The detection circuit also includes switch a circuit (32) connected between the common nodes and a reference potential, a driver (30) for applying a drive signal across each series circuit, a line for activating the switch circuit (48) and a difference detector (34) for measuring the voltage difference between the common nodes. The switch circuit has a first state in which the common nodes are connected to the reference potential and a second state in which the common nodes are isolated from the reference potential and from one another. The drive signal comprises a series of first voltage transitions (104, 106) operative to vary the total voltage drop across each series circuit. The line for activating the switch circuit changes the switch circuit from the first state to the second state at or prior to each first voltage transition. Therefore after each first voltage transition, the difference between the voltages of the first and second common nodes is a measure of the difference between the capacitances of the first and second capacitive elements. A similar technique may be applied to the measurement of the capacitance of a single capacitor.

6 Claims, 7 Drawing Figures

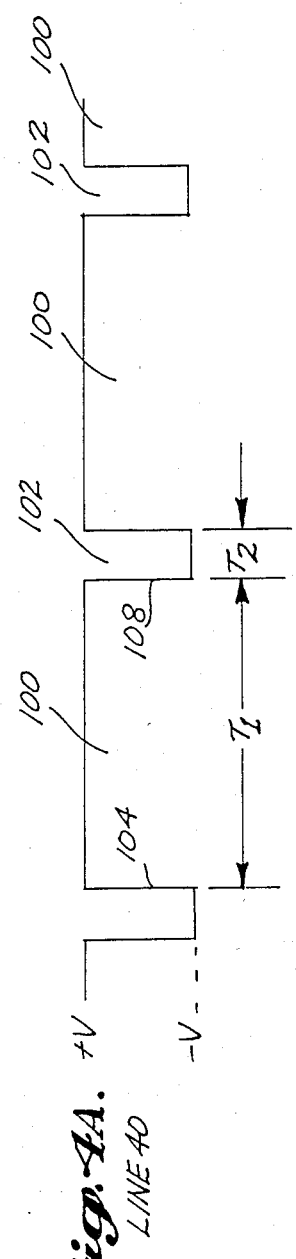
Fig. 4A. LINE 40
Fig. 4B. LINE 42
Fig. 4C. NODE 84
Fig. 4D. NODE 36

CHARGE BALANCING DETECTION CIRCUIT

TECHNICAL FIELD

The present invention relates to a circuit for measuring capacitance and to a bridge circuit for measuring the difference between the capacitances of first and second capacitive elements.

BACKGROUND OF THE INVENTION

In one type of prior accelerometer, a proof mass is suspended by a flexure hinge between upper and lower excitation rings. The upper surface of the proof mass includes a metal plate that, together with the upper excitation ring, forms a first capacitor. Similarly, the lower surface of the proof mass includes a metal plate that, together with the lower excitation ring, forms a second capacitor. As the proof mass moves upward or downward along its sensitive axis in response to accelerations, movement of the proof mass from its null or centered position is detected by measuring the difference between the capacitances of the first and second capacitors. The resulting "movement" signal causes a servo system to energize electromagnets to return the proof mass to its null position. The magnitude of the drive current provided to the electromagnets is then a measure of the acceleration.

A critical component of such an accelerometer is the pickoff detection circuit used to detect changes in the capacitances of the first and second capacitors. The detection circuit must present the maximum detected signal possible to the servo system in order to minimize the effect of offset voltages and currents. The detection circuit furthermore should operate without placing error sources, such as P-N junctions, in the DC signal path. The problem of sensitive and accurate detection becomes particularly accute when the accelerometer must function in a high radiation environment that imparts parametric changes to the component semiconducting devices. Furthermore, for many applications, the circuit component count must be minimized in order to meet size, weight and packaging constraints.

SUMMARY OF THE INVENTION

In one aspect, the present invention provides a detection circuit for measuring the difference between the capacitances of first and second capacitive elements. The detection circuit comprises a first capacitor serially connected to the first capacitive element at a first common node to form a first series circuit, and a second capacitor serially connected to the second capacitive element at a second common node to form a second series circuit. The detection circuit further comprises switch means connected between the common nodes and a reference potential, drive means for applying a drive signal across each series circuit, switch activation means, and means for measuring the voltage difference between the common nodes. The switch means has a first state in which the common nodes are connected to the reference potential and a second state in which the common nodes are isolated from the reference potential and from one another. The drive signal comprises a series of first voltage transitions operative to vary the total voltage drop across each series circuit. The switch activation means changes the switch means from the first state to the second state at or prior to each first voltage transition. As a result, after each first voltage transition, the difference between the voltages at the first and second common nodes is a measure of the difference between the capacitances of the first and second capacitive elements.

In another aspect, the present invention provides a circuit for measuring the capacitance of a capacitive element. The circuit comprises a capacitor serially connected to the capacitive element at a common node to form a series circuit, and switch means connected between the common node and a reference potential. The switch means has a first state in which the common node is connected to the reference potential and a second state in which the common node is isolated from the reference potential. The circuit further comprises drive means for applying a drive signal across the series circuit, switch activation means, and means for measuring the voltage at the common node. The drive signal comprises a series of first voltage transitions operative to vary the total voltage drop across the series circuit. The switch activation means changes the switch means from the first state to the second state at or prior to each first voltage transition. As a result, after each first voltage transition, the voltage at the common node is a measure of the capacitance value of the capacitive element.

BRIEF DESCRIPTION OF THE DRAWINGS

FIGS. 4A-D is a signal diagram for the detection circuit of FIG. 3.

DETAILED DESCRIPTION

Figure 1:
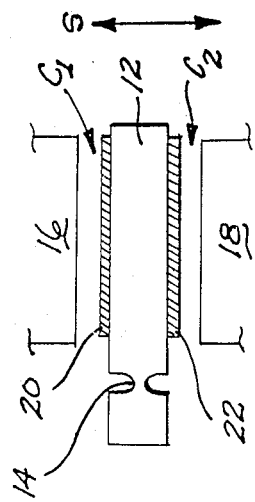
FIG. 1 is a schematic view of an accelerometer with which the detection circuit of the present invention may be used.

The detection circuit of the present invention is particularly suited for use with an accelerometer of the type schematically illustrated in FIG. 1. The accelerometer comprises proof mass 12 suspended by flexure hinge 14 between upper and lower excitation rings 16 and 18, respectively. The upper surface of proof mass 12 includes metal plate 20 that together with excitation ring 16 forms a first capacitor $C_1$. Similarly, the lower surface of proof mass 12 includes metal plate 22 that together with excitation ring 18 forms a second capacitor $C_2$. In the absence of acceleration along sensitive axis S, proof mass 12 is in its centered or null position in which the capacitances of capacitors $C_1$ and $C_2$ are equal to each other. In response to an acceleration change along sensitive axis S, proof mass 12 moves upward or downward toward one of the excitation rings. As a result, the capacitance of one of the capacitors increases while the capacitance of the other capacitor decreases by an essentially equal amount. Capacitors $C_1$ and $C_2$ are connected to a suitable detection circuit and servo system that is operative to energize electromagnets that cause the proof mass to return to its null position. The magnitude of the drive current provided to the electromagnets is then a measure of the acceleration along the sensitive axis. Accurate operation of an accelerometer of the type described requires a detection circuit for accurately measuring small differences between the capacitances of capacitors $C_1$ and $C_2$. Such a detection circuit is provided by the present invention. It is to be understood, however, that the detection circuit of the present invention may be used in other applications in which the value of a capacitance or the difference between capacitances must be precisely measured.

Figure 2:
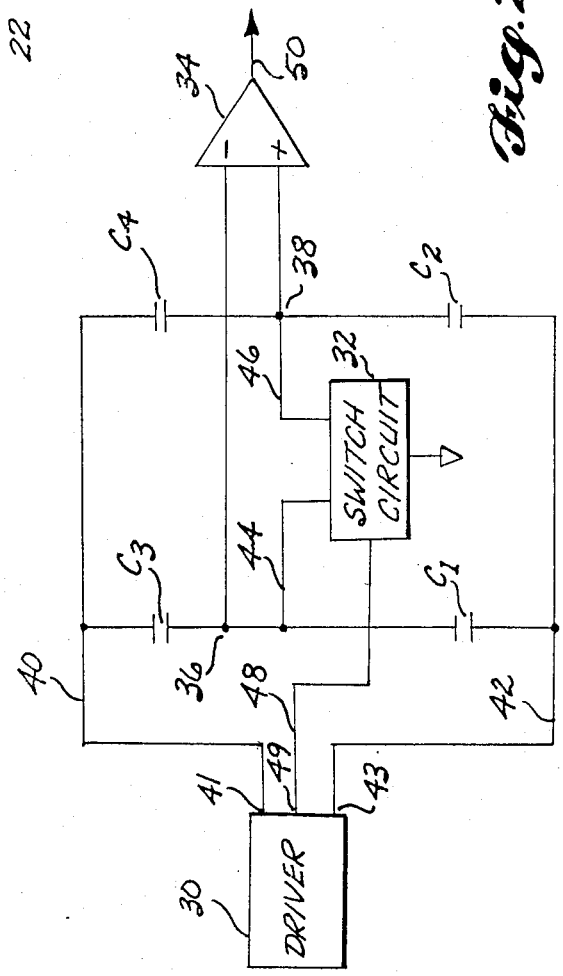
FIG. 2 is a circuit diagram of one preferred embodiment of the detection circuit of the present invention.

One preferred embodiment of the detection circuit of the present invention is illustrated in FIG. 2. The circuit of FIG. 2 is adapted to measure the difference in capacitance between capacitors $C_1$ and $C_2$. The detection circuit comprises driver 30, capacitors $C_3$ and $C_4$, switch circuit 32 and difference detector 34. Capacitors $C_1$ and $C_3$ are connected in series at common node 36, and capacitors $C_2$ and $C_4$ are connected in series at common node 38. Capacitors $C_1$–$C_4$ therefore form a bridge circuit having a first bridge arm comprising capacitors $C_1$ and $C_3$ and a second bridge arm comprising capacitors $C_2$ and $C_4$. Each bridge arm is connected between lines 40 and 42, lines 40 and 42 in turn being connected to drive terminals 41 and 43 respectively of driver 30. The operation of driver 30 is described below. Common nodes 36 and 38 are connected to switch circuit 32 by lines 44 and 46, respectively. Switch circuit 32 is connected to switch terminal 49 of driver 30 by line 48, the switch circuit being adapted to short lines 44 and 46 to ground in response to an appropriate signal from the driver on line 48. Common nodes 36 and 38 are also connected to the input terminals of difference detector 34. Difference detector 34 is operative to produce an output signal on line 50 that has a magnitude or other characteristic proportional to the voltage difference between nodes 36 and 38.

In operation, driver 30 provides a series of drive pulses between drive terminals 41 and 43. Such drive pulses are therefore applied to bridge arms $C_1$–$C_3$ and $C_2$–$C_4$ via lines 40 and 42. Before the application of each drive pulse, driver 30 issues a signal at switch terminal 49 that is coupled to switch circuit 32 by line 48 and that causes the switch circuit to connect common nodes 36 and 38 to ground. Once the common nodes have reached ground potential, the driver changes the signal at switch terminal 49 so as to cause switch circuit 32 to isolate each common node by breaking the connection between the node and ground, such change occurring either at or prior to the production of each drive pulse. The voltage of each drive pulse distributes itself between the capacitors of each bridge arm in proportion to the present values of the respective capacitors. Therefore after application of each drive pulse, the voltage difference between common nodes 36 and 38 is a measure of the difference between the capacitance values of capacitors $C_1$ and $C_2$. This difference is detected by difference detector 34, and reflected in the output signal on line 50.

Figure 3:
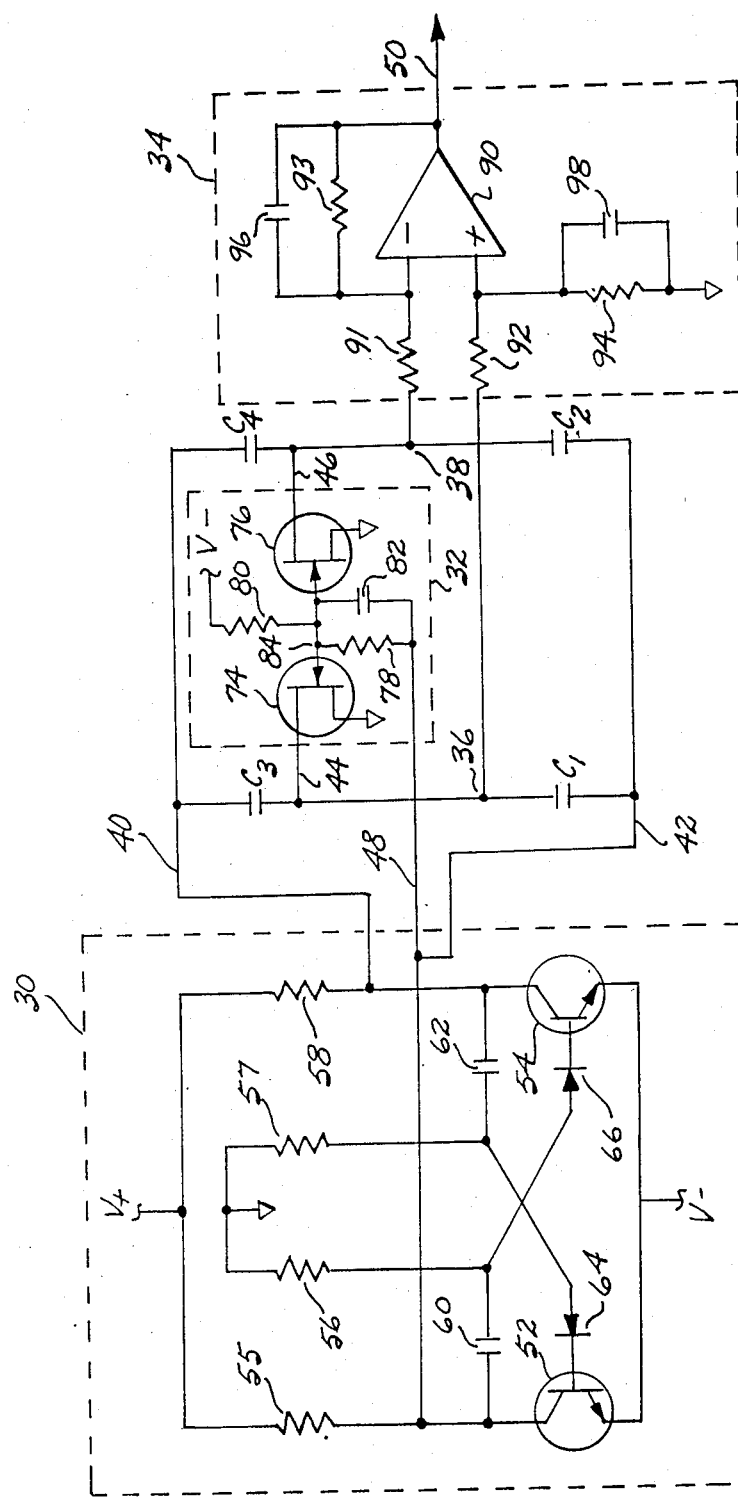
FIG. 3 is a detailed circuit diagram of one embodiment of the detection circuit of FIG. 2.

FIG. 3 presents a detailed circuit diagram of one preferred embodiment of the detection circuit of the present invention. In this embodiment, driver 30 comprises a conventional, astable multivibrator comprising transistors 52 and 54, resistors 55–58, capacitors 60 and 62, and diodes 64 and 66. Driver 30 of FIG. 3 is intended for operation between equal and opposite voltage sources $V_+$ and $V_-$. As is well known, the frequency of oscillation of driver 30 can readily be selected by appropriate choices for resistors 56 and 57 and capacitors 60 and 62. In accordance with the present invention, such components are selected to produce waveforms such as those shown in FIGS. 4A and 4B. FIG. 4A illustrates the voltage produced by driver 30 on line 40. The voltage waveform comprises a series of pulses 100 of length (i.e., time duration) $T_1$ separated by gaps 102 of length $T_2$. As indicated by FIG. 4B, the voltage waveform on line 42 is the complement of the waveform on line 40, such that the positive going transitions 104 on line 40 occur simultaneously with the negative going transitions 106 on line 42, and the negative going transitions 108 on line 40 occur simultaneously with the positive going transitions 110 on line 42. The effective size of the voltage pulses applied by driver 30 to each bridge arm is therefore 4 V, twice the effective supply voltage of 2 V.

Switch circuit 32 of the embodiment of FIG. 3 comprises FETs 74 and 76, resistors 78 and 80, and capacitor 82. The FET gates are interconnected at node 84. The FET drains are connected to common nodes 36 and 38 respectively, and the FET sources are both connected to ground. Resistor 78 is connected between line 48 and node 84, line 48 in turn being connected to line 42. Resistor 80 is connected between node 84 and voltage source $V_-$. Resistors 78 and 80 are preferably selected to be equal in magnitude, such that the voltage waveform indicator in FIG. 4C is produced at node 84. During time intervals $T_2$, the gates of FETs 74 and 76 are therefore at ground potential, and as a result the FETs connect common nodes 36 and 38 to ground during time intervals $T_2$. However, during time intervals $T_1$, the FET gates are at potential $V_-$, common nodes 36 and 38 are isolated from ground, and the only charge leakage path from common nodes 36 and 38 is through difference detector 34. The transitions 112 in the voltage waveform at node 84 between ground potential and potential $V_-$ occur simultaneously with transitions 104 and 106 in the waveforms on lines 40 and 42 respectively. For optimum performance of the detection circuit, tranistions 112 may occur slightly prior to transitions 104 and 106, to ensure that FETs 74 and 76 are fully switched off at the commencement of pulses 100. However, deriving the FET gate signal from the drive pulses, as in the circuit of FIG. 3, minimizes the component count and may therefore be preferred for many applications. The function of capacitor 82 of switch circuit 32 is to increase the speed at which FETs 74 and 76 turn off (i.e., switch to a non-conducting state) with the appearance of a drive pulse.

Difference detector 34 of FIG. 3 is configured as a conventional differential amplifier comprising op amp 90, resistors 91–94, and capacitors 96 and 98. The values of these components may be selected to produce an appropriate gain, such that the output signal on line 50 is a predetermined multiple of the difference between the voltages at common nodes 36 and 38. However, the values of resistors 91–94 should be selected to be comparatively large, so that difference detector 34 has a high input impedance, in order to minimize the rate at which charge may leak from common nodes 36 and 38 during time intervals $T_1$.

The operation of the circuit of FIG. 3 will now be described, with reference to the timing diagrams of FIG. 4. It will be assumed that the null values of capacitors $C_1$ and $C_2$ are equal to one another, a condition that typically obtains for an accelerometer of the type shown in FIG. 1. It will further be assumed that capacitances of capacitors $C_3$ and $C_4$ have been selected to be equal to one another and to the null value of capacitors $C_1$ and $C_2$. During time intervals $T_2$, common nodes 36 and 38 are shorted to ground because of the zero potential applied to the gates of FETs 74 and 76, and each capacitor $C_1$–$C_4$ charges to V volts in the polarities indicated by the waveforms of FIGS. 4A and 4B. Time interval $T_2$ should be chosen to be long enough to permit common nodes 36 and 38 to reach ground potential, despite the inherent channel resistance of the respective FETs. FIG. 4D illustrates the voltage waveform at common node 36 for the case in which the capacitance of capacitor $C_1$ has decreased from its null value to a value less than that of capacitor $C_3$. The portion of the FIG. 4D waveform indicated by numeral 114 illustrates the return of the voltage at node 36 to ground at a rate determined by the values of capacitors $C_1$ and $C_3$ and the channel resistance of FET 74.

At the beginning of each pulse 100 on line 40 (and of the corresponding complementary pulse on line 42), switch 32 isolates each of the common nodes, and each bridge arm $C_1$–$C_3$ and $C_2$–$C_4$ is allowed to assume its natural equilibrium. The voltage at each common node 36 and 38 will reflect the ratio between the capacitors forming the respective bridge arm. If $C_1$ is not equal to $C_2$, then the voltage difference between common nodes 36 and 38 will be detected and amplified by difference detector 34, and will appear as an output signal on line 50. Assuming that $C_1$ and $C_2$ have changed equally in opposite directions, then the voltages at common nodes 36 and 38 will be equally displaced in opposite directions with respect to ground potential. FIG. 4D illustrates the voltage at common node 36 rising to a value of $V_S$ upon application of the drive pulses. The voltage at common node 36 then slowly decreases during time interval $T_1$. This decreasing voltage during time interval $T_1$ represents leakage of charge from common node 36, e.g., leakage through difference detector 34. The length of time interval $T_1$ is therefore limited by the rate at which charge leaks from common node 36. However, the length of time interval $T_1$ is not per se limited by the rate of change of the capacitances of capacitors $C_1$ and $C_2$, inasmuch as conservation of charge at each common node dictates that the signals (e.g., $V_S$) will track any change that occurs in the respective capacitors during time interval $T_1$.

As described previously, voltage transitions 112 at node 84 (FIG. 4C) may occur either simultaneously with or prior to transitions 104 and 106 on lines 40 and 42 respectively. In the embodiment of FIG. 3, the voltage at node 84 is derived directly from line 42. This arrangement is generally more convenient than providing a separate signal source for line 48, and can be used so long as the rise time of pulses 100 is kept short relative to the RC time constant of the bridge capacitors and the FET channel resistance. The fall time of pulses 110 is not critical and need not occur rapidly.

Although it is not necessary to select $C_3$ and $C_4$ to have capacitance values equal to the null capacitance value of capacitors $C_1$ and $C_2$, this equality results in the highest pickoff gain and the least common mode signal between common nodes 36 and 38 when the drive voltages on line 40 and 42 are symmetric with respect to ground. If the drive voltages are unbalanced, then the capacitance values of capacitors $C_3$ and $C_4$ would preferably be adjusted accordingly to produce a minimum common mode signal at difference detector 34.

While the preferred embodiments of the invention have been illustrated and described, it should be understood that variations will be apparent to those skilled in the art. Accordingly, the invention is not to be limited to the specific embodiments illustrated and described, and the true scope and spirit of the invention are to be determined by reference to the following claims.

The embodiments of the invention in which an exclusive property or privilege is claimed are defined as follows:

1. A detection circuit for measuring the difference between the capacitances of first and second capacitive elements, comprising:
   a first capacitor having a fixed capacitance value, the first capacitor being serially connected to the first capacitive element at a first common node to form a first series circuit;
   a second capacitor having a fixed capacitance value, the second capacitor being serially connected to the second capacitative element at a second common node to form a second series circuit;
   switch means connected between the first and second common nodes and a reference potential, the switch means having a first state in which each common node is connected to the reference potential and a second state in which each common node is isolated from the reference potential and from the other common node;
   drive means for applying a drive signal across both series circuits simultaneously, the drive signal comprising a series of first voltage transitions operative to vary the total voltage drop across each series circuit;
   switch activation means for changing the switch means from the first state to the second state at or prior to each first voltage transition; and
   means for measuring the voltage difference between the first and second common nodes.

2. The detection circuit of claim 1, wherein the drive signal comprises a first drive signal that is applied to one end of each series circuit and a second drive signal that is complementary to the first drive signal and that is applied to the other end of each series circuit.

3. The detection circuit of claim 2, wherein the first drive signal comprises a series of drive pulses, each drive pulse having a leading edge comprising the first voltage transition and a falling edge, each first voltage transition being operative to vary the voltage of the first drive signal from a first voltage level to a second voltage level.

4. The detection circuit of claim 3, wherein the reference potential is between the first and second voltage levels.

5. The detection circuit of claim 3, wherein the switch activation means comprises means for providing a series of switch pulses that occur simultaneously with respect to the first drive signal, such that the switch means is in its first state from the trailing edge of one drive pulse to the leading edge of the subsequent drive pulse and is in its second state from the leading edge of each drive pulse to the trailing edge of that drive pulse.

6. A circuit for measuring the capacitance of a capacitive element, comprising:
   a capacitor having a fixed capacitance value, the capacitor being serially connected to the capacitive element at a common node to form a series circuit;
   switch means connected between the common node and a reference potential, the switch means having a first state in which the common node is connected to the reference potential and a second state in which the common node is isolated from the reference potential;
   drive means for applying a drive signal across the series circuit, the drive signal comprising a series of first voltage transitions operative to vary the total voltage drop across the series circuit, the drive signal comprising a series of drive pulses, each drive pulse having a leading edge comprising the first voltage transition and a falling edge;

switch activation means for changing the switch means from the first state to the second state at each first voltage transition, the switch activation means comprising means for providing a series of switch pulses that occur simultaneously with respect to the drive signal, such that the switch means is in its first state from the trailing edge of one drive pulse to the leading edge of the subsequent drive pulse and is in its second state from the leading edge of each drive pulse to the trailing edge of that drive pulse; and means for measuring the voltage at the common node.

* * * * *